(12) United States Patent
Jan et al.

(10) Patent No.: US 10,102,896 B2
(45) Date of Patent: Oct. 16, 2018

(54) ADAPTIVE REFERENCE SCHEME FOR MAGNETIC MEMORY APPLICATIONS

(71) Applicants: Headway Technologies, Inc., Milpitas, CA (US); IBM Corporation, Yorktown Heights, NY (US)

(72) Inventors: Guenole Jan, San Jose, CA (US); Po-Kang Wang, Los Altos, CA (US); John De Brosse, Colchester, VT (US); Yuan-Jen Lee, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/686,448

(22) Filed: Aug. 25, 2017

(65) Prior Publication Data

US 2017/0352395 A1    Dec. 7, 2017

Related U.S. Application Data

(62) Division of application No. 14/980,050, filed on Dec. 28, 2015, now Pat. No. 9,747,965.

(51) Int. Cl.
| | | |
|---|---|---|
| *G11C 11/15* | (2006.01) | |
| *G11C 11/16* | (2006.01) | |

(Continued)

(52) U.S. Cl.
CPC ........ *G11C 11/1673* (2013.01); *G11C 11/417* (2013.01); *G11C 17/02* (2013.01); *G11C 29/44* (2013.01)

(58) Field of Classification Search
CPC .................................................. G11C 11/409

(Continued)

(56) References Cited

U.S. PATENT DOCUMENTS

| | | | | |
|---|---|---|---|---|
| 7,239,537 | B2 * | 7/2007 | DeBrosse | G11C 11/16 365/154 |
| 8,482,950 | B2 * | 7/2013 | Kitagawa | G11C 11/5678 365/189.05 |

(Continued)

OTHER PUBLICATIONS

Basic Linear Design, edited by Hank Zumbahlen, Analog Devices, Copyright 2007 Analog Devices, Inc., ISBN 0-916550-28-1, pp. 1.33-1.37.

(Continued)

*Primary Examiner* — Son Mai
(74) *Attorney, Agent, or Firm* — Saile Ackerman LLC; Stephen B. Ackerman; Billy Knowles

(57) ABSTRACT

A circuit and method for adaptive trimming of the reference signal for sensing data during a read operation of magnetic memory cells to improve read margin for the magnetic memory cells. The circuit has a trim one-time programmable memory array programmed with offset trim data applied to magnetic memory array sense amplifiers. Sense amplifier trimming circuits receive and decode the trim data to determine offset trim signal magnitude to adjust the reference signal to improve the read margin. The method sets the offset trim level to each increment of the offset trim level. Data is written and read to the magnetic memory array, the number of errors in the array is accumulated for each setting of the offset trim level. The error levels are compared and the appropriate trim level is programmed to the trim memory cells such that a read margin of the sense amplifier is improved.

20 Claims, 9 Drawing Sheets

(51) Int. Cl.
  *G11C 29/44* (2006.01)
  *G11C 17/02* (2006.01)
  *G11C 11/417* (2006.01)

(58) Field of Classification Search
  USPC .......................................................... 365/209
  See application file for complete search history.

(56) References Cited

U.S. PATENT DOCUMENTS

| | | | |
|---|---|---|---|
| 8,693,273 | B2 | 4/2014 | Yuh et al. |
| 9,251,881 | B2 * | 2/2016 | Kim .................... G11C 11/1673 |
| 2004/0136236 | A1 | 7/2004 | Cohen |
| 2010/0328992 | A1 | 12/2010 | Kano et al. |
| 2013/0051133 | A1 | 2/2013 | Son et al. |
| 2015/0022264 | A1 | 1/2015 | Kim et al. |
| 2015/0124515 | A1 | 5/2015 | Jung et al. |
| 2015/0220388 | A1 | 8/2015 | Wu et al. |

OTHER PUBLICATIONS

A high-density and high-speed T-4MTJ MRAM with Voltage Offset Self-Reference Sensing Scheme, 11-2, by Hiroaki Tanizaki et al., Nov. 2006, 0-7803-9735-5/06, pp. 303-306.

"A novel sensing algorithm for Spin-Transfer-Torque magnetic RAM (STT-MRAM) by utilizing dynamic reference," by Yong-Sik Park et al., IEICE Electronics Express, vol. 9, No, 3, Nov. 16, 2011, pp. 153-159.

"Signal-Margin-Screening for Multi-Mb MRAM," by H. Honigschmid et al., ISSCC 2006 /Session 7 / Non-Volatile Memory / 7.3, Feb. 2006, 10 pgs.

International Search Report, Application No: PCT/US2016/067234, Applicant: Headway Technologies, Inc., dated May 19, 2017, 15 pgs.

PCT Search Report, International Application No. PCT/US2016/067234, Applicant: Applicant: Headway Technologies, Inc., dated Sep. 19, 2017, 12 pgs.

\* cited by examiner

ADAPTIVE REFERENCE SCHEME FOR MAGNETIC MEMORY APPLICATIONS

The present invention is a divisional application that claims priority under 35 U.S.C. § 120 from U.S. patent application Ser. No. 14/980,050, filing date Dec. 28, 2015, now U.S. Pat. No. 9,747,965, issued Aug. 29, 2017, incorporated herein by reference in its entirety.

BACKGROUND

Technical Field

This disclosure relates generally to sense amplifiers within magnetic memory arrays. More particularly, this disclosure relates to an adaptive reference circuit providing an adjustable reference signal for sense amplifiers of magnetic memory arrays based on compensation for variation in sense amplifier input offset.

Background

To retrieve information from a magnetic memory array, a sense amplifier typically compares the current flowing through the device under an applied voltage to a reference current. Generally this reference current is generated by applying voltage to a set of reference devices, half of which are set to the high conductance state ("0" or Parallel orientation) and the other half to the low conductance state ("1" or Anti-Parallel orientation). The sense amplifier compares the average current from those reference cells with the current from the device and generates an output signal having a voltage level representing a digital "0" or "1".

FIG. 1 is a schematic diagram of a magnetic memory array 5. The magnetic memory array has a data magnetic memory sub-array 10 and a reference magnetic memory sub-array 15.

The data magnetic memory sub-array 10 is formed of magnetic memory cells MC00, ... MC0n, ..., MCm0, ..., MCmn arranged in rows and columns. Each of the magnetic memory cells MC00, ... MC0n, ..., MCm0, ..., MCmn has a magnetic tunnel junction element MTJ and a gating transistor M1 connected serially. A drain of each of the gating transistors M1 is connected to a first terminal of the associated magnetic tunnel junction element MTJ. The source of each of the gating transistors M1 is connected to a ground reference point. The second terminals of the magnetic tunnel junction element MTJ situated on one column are commonly connected to a data bit line DBL0, ..., DBLn associated with the one column. Each row of the magnetic memory cells MC00, ... MC0n, ..., MCm0, ..., MCmn is associated with one word line WL0, WL1, ..., WLm. The gate of the gating transistors M1 of each of the magnetic memory cells MC00, ... MC0n, ..., MCm0, ..., MCmn on each row is connected to the associated word line WL0, WL1, ..., WLm. The word lines WL0, WL1, ..., WLm are collectively connected to a word line decode circuit 20. The word line decode circuit 20 selects the row of magnetic memory cells MC00, ... MC0n, ..., MCm0, ..., MCmn to be activated for reading or writing and biases the associated word line WL0, WL1, ..., WLm to activate the gating transistor M1 of the selected magnetic memory cells MC00, ... MC0n, ..., MCm0, ..., MCmn.

The data bit lines DBL0, ..., DBLn that are collectively connected to the columns of the magnetic memory cells MC00, ... MC0n, ..., MCm0, ..., MCmn are connected to the bit line biasing and selection circuit 25. The bit line biasing and selection circuit 25 generates the necessary currents and voltages for writing and reading the selected row of magnetic memory cells MC00, ... MC0n, ..., MCm0, ..., MCmn. The bit line biasing and selection circuit 25 is connected to a data input of a sense amplifier 35. The sense amplifier 35 compares a read signal for each of the selected magnetic memory cells MC00, ... MC0n, ..., MCm0, ..., MCmn of the data bit lines DBL0, ..., DBLn for determining the data read.

The reference magnetic memory array 15 is formed of at least one set of paired columns of reference magnetic memory cells RCP0, RCAP0, ..., RCPm, RCAPm. Each pair of the reference magnetic memory cells RCP0, RCAP0, ..., RCPm, RCAPm is connected to one row of the data magnetic memory array 10. The reference magnetic memory cells RCP0, RCAP0, ..., RCPm, RCAPm are structurally identical to the data magnetic memory cells MC00, ... MC0n, ..., MCm0, ..., MCmn as described above. However, the reference magnetic memory cells RCP0, RCAP0, ..., RCPm, RCAPm are programmed such that one column of the reference magnetic memory cells RCP0, RCAP0, ... RCPm, RCAPm are programmed to parallel or "0" state and the reference magnetic memory cells RCP0, RCAP0, ... RCPm, RCAPm of the adjacent column are programmed to anti-parallel or "1" state. The second terminal of the magnetic tunnel junction element MTJ of the reference magnetic memory cells RCP0, RCAP0, ... RCPm, RCAPm on each column are connected to a reference bit line RBL0 and RBL1. The reference bit lines RBL0 and RBL1 are connected to a reference bit line biasing and averaging circuit 35. The reference bit line biasing and averaging circuit 35 provides the necessary biasing current and voltage levels for writing and reading the reference magnetic memory cells RCP0, RCAP0, ... RCPm, RCAPm. Further, the reference bit line biasing and averaging circuit 35 joins the signals of the paired columns of the reference magnetic memory cells RCP0, RCAP0, ... RCPm, RCAPm to average the signals to form a reference signal REF to the sense amplifier 40. FIG. 1 shows a single sense amplifier 40, when in fact, there is multiple sense amplifiers. Each column of the magnetic memory cells MC00, MC0n, ... MCm0, ..., MCmn of the data magnetic memory array 10 may have one sense amplifier connected to receive the read signal from is associated column of the magnetic memory cells MC00, ... MC0n, ... MCm0, ... MCmn. The averaged reference signal REF as applied from the reference bit line biasing and averaging circuit 35 to the sense amplifier 40 is compared in the sense amplifier 40 to the data signal DATA from the selected magnetic memory cells MC00, ... MC0n, ... MCm0, ... MCmn to determine the data output signal 45 of the magnetic memory array 5.

The read margin is then defined as the signal separation between the data signal DATA and the averaged reference signal REF. In principle, it is desirable to minimize the variations of the averaged reference signal REF so as not to subtract from the read margin. There are three major sources of variations. The first is the sense amplifier 40 variation (one sense amplifier for each column of the magnetic memory cells MC00, ... MC0n, ... MCm0, ... MCmn). This variation usually manifests itself as variation in sense amplifier offset. This can be overcome by adjusting offset of each sense amplifier 40 at the time of fabrication and testing. The second source of variation is the contribution from parasitic impedance, such as bit line resistance. This is often overcome by mimicking reference bit lines RBL0 and RBL1 to data bit lines DBL0, DBLn, and select from multiple of reference devices ones that have similar parasitic impedance and loading as the target devices. The third source of variation is from the variation between reference devices themselves. This variation can be minimized by averaging multiple reference magnetic memory cells RCP0, RCAP0, . . . , RCPm, RCAPm. This may be accomplished by using more columns of reference magnetic memory cells RCP0, RCAP0, . . . , RCPm, RCAPm rather than the two shown. The usual minimum of two reference bit lines already reduces this variation by a factor of 1.4. Some system averages four columns of the reference magnetic memory cells RCP0, RCAP0, . . . , RCPm, RCAPm to double the reduction. Because the variation of the two signal levels of the high conductance state ("0" or Parallel orientation) and to the low conductance state ("1" or Anti-Parallel orientation) is not the same, the optimal reference level is not necessarily midway between parallel orientation and anti-parallel orientation signal levels. To systematically offset reference signal REF, U.S. Pat. No. 8,693,273 (Yuh, et al.) teaches that the reference signal level REF can be adjusted by changing the number of parallel oriented and anti-parallel oriented reference magnetic memory cells RCP0, RCAP0, . . . , RCPm, RCAPm to systematic shift the reference level.

The methods of using more reference magnetic memory cells RCP0, RCAP0, . . . , RCPm, RCAPm in parallel or varying the number of parallel oriented and anti-parallel oriented reference magnetic memory cells RCP0, RCAP0, . . . , RCPm, RCAPm aim to produce one optimal consistent reference signal REF relative the device signals. As technology improvements permit smaller scaling of integrated circuit features, both the manufacturing process and the material uniformity induces more circuit variations. When the variations reach a certain level, even a "perfect" reference signal REF is no longer adequate to allow reliably reading data from the magnetic memory array 5.

SUMMARY

An object of this disclosure is to provide a circuit for adaptive trimming of the reference signal for sensing data during a read operation of magnetic memory cells to improve read margin for the magnetic memory cells.

Another object of this disclosure is to provide a method for determining an adaptive trim level for the reference signal for sensing data during a read operation of magnetic memory cells to improve read margin for the magnetic memory cells.

Further, another object of this disclosure is to provide a circuit for retaining adaptive trim levels for the reference signal for sensing data during a read operation of magnetic memory cells to improve read margin for the magnetic memory cells.

To accomplish at least one of these objects, an adaptive trimming circuit within a magnetic memory device includes a trim one-time programmable memory array formed of memory cells that are programmed with the at least one trim level describing a magnitude of a trim signal that modifies a reference signal level applied to a sense amplifier connected for sensing data present in an array of magnetic memory cells. The one-time programmable memory cells are connected to trim bit lines. The trim bit lines are connected to the bit line decoder of the magnetic memory array for selecting the bit lines.

In various embodiments, the one-time programmable memory cells are formed of magnetic tunnel junction elements that are exposed to sufficient voltage that the magnetic tunnel junction elements are structured as anti-fuses. The magnetic tunnel junctions of the trim array are smaller than those of the data magnetic memory array to effectively increase the resistance of the trim data magnetic memory cells while not affecting the data magnetic memory cells during the programming of the trim data magnetic memory cells.

The adaptive trimming circuit includes a trim bit line decoder for selecting and biasing the one-time programmable memory cells for programming and reading the one-time programmable memory cells. Since the one-time programmable memory cells are fabricated to have smaller feature sizes than the data magnetic cells, the trim bit line decoder generates the biasing signals for programming the one-time programmable cells such that the two electrodes of the magnetic tunnel junction element are electrically shorted.

An output of the trim bit line decoder is connected to a sense amplifier trimming circuit within a sense amplifier receiving the data read from the data magnetic memory array and the reference signal from the reference magnetic memory array. The sense amplifier trimming circuit receives the trim data from the trim one-time programmable memory array and decodes the trim data to determine the magnitude of the offset signal that needs to be applied to adjust the reference signal to improve the read margin of the sense amplifier.

In various embodiments, the adaptive trimming circuit has a temporary storage array connected between the trim bit line decoder and the sense amplifier trim circuit. The temporary storage receives the trim data from the trim one-time programmable read only array and provides a faster access time for transferring the trim data to the sense amplifier trim circuit during operation. The temporary storage may be a static random access memory (SRAM) or data registers. In some embodiments, the SRAM or the data registers are formed of magnetic tunnel junction logic elements.

In other embodiments that accomplish at least one of these objects, a test system evaluates and establishes the offset signal level that needs to be applied to adjust the reference signal to improve the read margin of the sense amplifiers of a magnetic memory device. The test system includes a test controller executing a program method for activating test circuitry to provide test signals to and receive test responses from the magnetic memory device. The test controller performs a program method for establishing an offset signal to be applied to adjust the reference signal to improve the read margin of the sense amplifier of a magnetic memory device.

The test system has a data storage unit that includes non-transitory computer processor readable medium having stored thereon a program of instructions readable and executable by the test controller. The program of instructions for activating test circuitry executes a method that begins by setting the offset trim level of the sense amplifier(s) of the segment of the magnetic memory to an initial signal level. This maybe the highest or lowest of the offset level within an adaptive band within which the reference level signal is allowed to vary. Test configuration data is set to write a signal level representative of a first binary level ("1") to all the magnetic memory cells of the selected segment of the magnetic memory. The segment of the magnetic memory is read and the number of errors within the segment is accumulated. The test configuration data is the set to write a signal level representative of a second binary level ("0") to all the magnetic memory cells of the selected segment of the magnetic memory. The segment of the magnetic memory is read and the number of errors within the segment is accumulated. The total accumulated errors are recorded.

The offset trim level of the sense amplifier(s) of the segment of the magnetic memory is then incremented to a next signal level. The test configuration data to write a signal level representative of a first binary level ("1") to all the magnetic memory cells of the selected segment of the magnetic memory. The segment of the magnetic memory is read and the number of errors within the segment is accumulated. The test configuration data is set to write a signal level representative of a second binary level ("0") to all the magnetic memory cells of the selected segment of the magnetic memory. The segment of the magnetic memory is read and the number of errors within the segment is accumulated. The total accumulated errors are recorded.

The increment of the trim level is tested to determine if the last trim level of the adaptive band within which the reference level signal is allowed to vary. If the increment is not the last trim level the last trim level the offset level is incremented to the next trim level, written and read for the first and second binary levels, and the error count for the segment of the magnetic memory is determined. This is repeated until all the trim levels within the adaptive band within which the reference level signal is allowed to vary have been tested.

When the segments of the magnetic memory have been tested for all the trim levels, the error counts for all the trim levels are compared are compared to determine which of the trim levels provides the greatest yield with the lowest error count. The trim level with the greatest yield is selected and the trim data indicating the selected trim level is programmed to the trim magnetic memory array. The testing and programming of the trim level for the selected segment is completed and the testing stopped. If there other segments of the magnetic to have their offset level adjusted, this method as described is repeated for each segment until all segments have been tested and their offset trim level programmed as trim data to their trim magnetic memory array.

DETAILED DESCRIPTION

Figure 2:
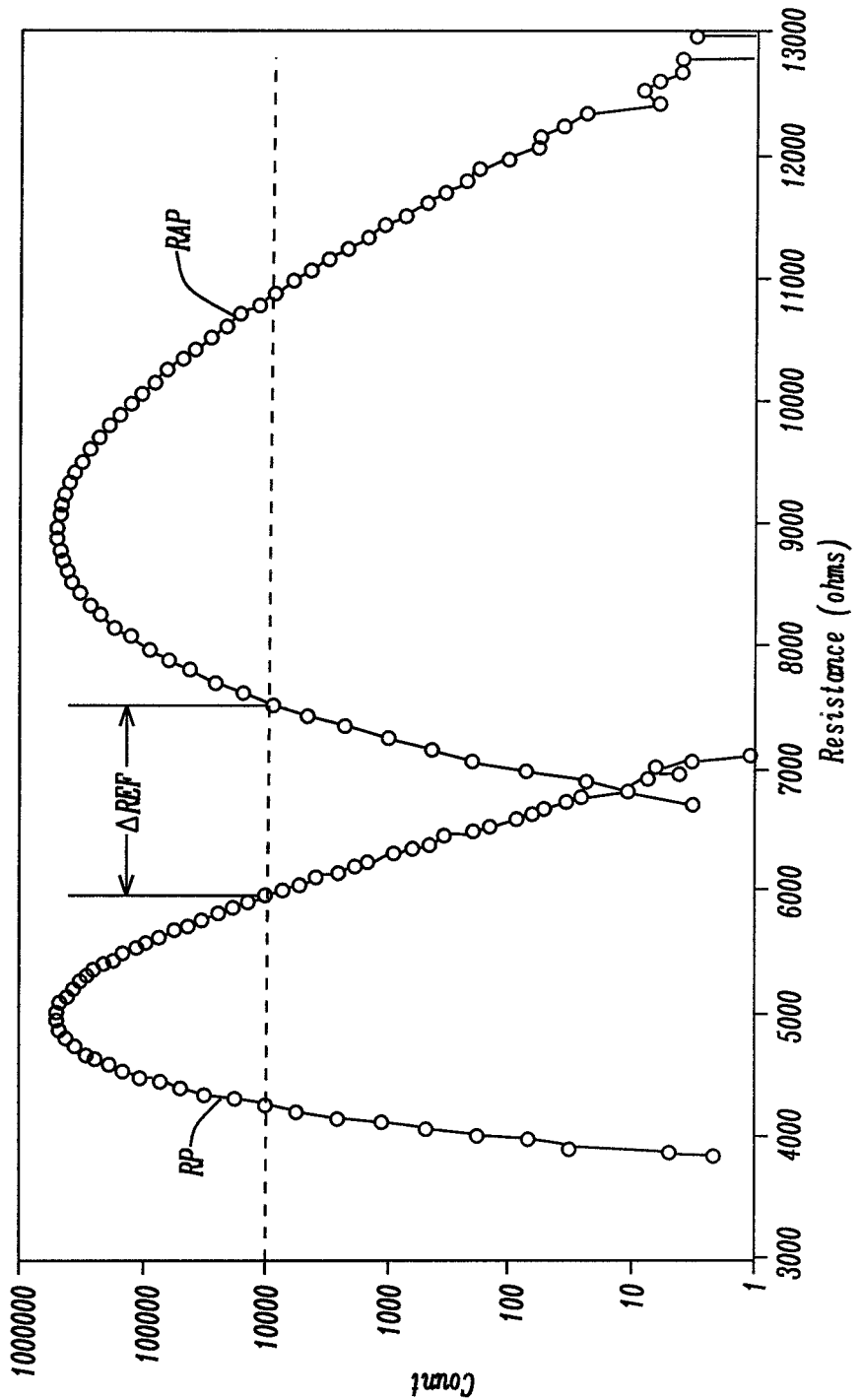
FIG. 2 is a plot of the distribution of resistance the parallel oriented and anti-parallel oriented reference magnetic memory cells of the related art.

FIG. 2 is a plot of the population distribution of resistance of magnetic memory cells RCP0, RCAP0, . . . RCPm, RCAPm when programmed to the parallel oriented or "0" state and the anti-parallel oriented or "1" state. It is assumed that the resistance has a covariance of 5% and a magneto-resistance ((Rap−Rp)/Rp) of 80% with a covariance of 5%. The plot illustrates a memory block of 8 Mb. One can see that there is no consistent reference signal. If the variations of the resistances the magnetic memory cells are random across the memory array, the reference signal level will vary dependent variances of the individual magnetic memory cell. Thus, it becomes clear from this graph that the strategy of using a consistent reference signal level will lead to more device failure than desirable.

Rather than having a consistent reference level, a principle embodying this invention is to vary each reference level to adapt to the specific group of magnetic tunnel junction cells for which the reference level is used. For instance, the sample size for such a sub-group of magnetic tunnel junction cells is usually chosen to be small (about 1024 magnetic tunnel junction cells or less). The specific reference level is far more likely to be adjusted to allow the correct reading of all the devices in that small group.

In the example as shown in FIG. 2, the reference level is adapted for every group of 1024 data bits. The margin is much improved for such a small group of devices. A band ΔREF is shown within which the reference level signal is allowed to vary. For most of the sub-groups of 1024 bits, a reference level set in the middle of the band will suffice. When an "outlier" shows up on the upper tail of the resistance Rp of the magnetic tunnel junction cells programmed to the parallel oriented or "0" state, the reference level can be pushed to the higher side. Likewise, when an "outlier" shows up on the lower tail of the resistance Rap of the magnetic tunnel junction cells programmed to the anti-parallel oriented or "1" state, the reference level can be pushed to the lower side. Since the likelihood of simultaneously having outliers on the upper tail of Rp and lower tail of Rap in one sub-group of 1024 bits is exceedingly small, these "unfortunate" sub-groups can be handled by redundancy replacement.

A way to vary each reference level within the adaptive band ΔREF that is in keeping with the principles of this disclosure is to offset the Sense Amplifier (SA) reference or data leg itself for each selected subsample of the magnetic tunnel junction cell population. Ideally the subsamples of magnetic tunnel junction cell population would each be a single word line or group of word lines that exhibit similar parasitic resistances. The offset trim data that is to be applied to the sense amplifier can be stored in a non-volatile portion of the chip. The trim data would be fetched from the non-volatile portion at start-up and stored in separate registers or used directly and fetched from the non-volatile portion and transferred to the sense amplifier during the read cycle.

Figure 1:
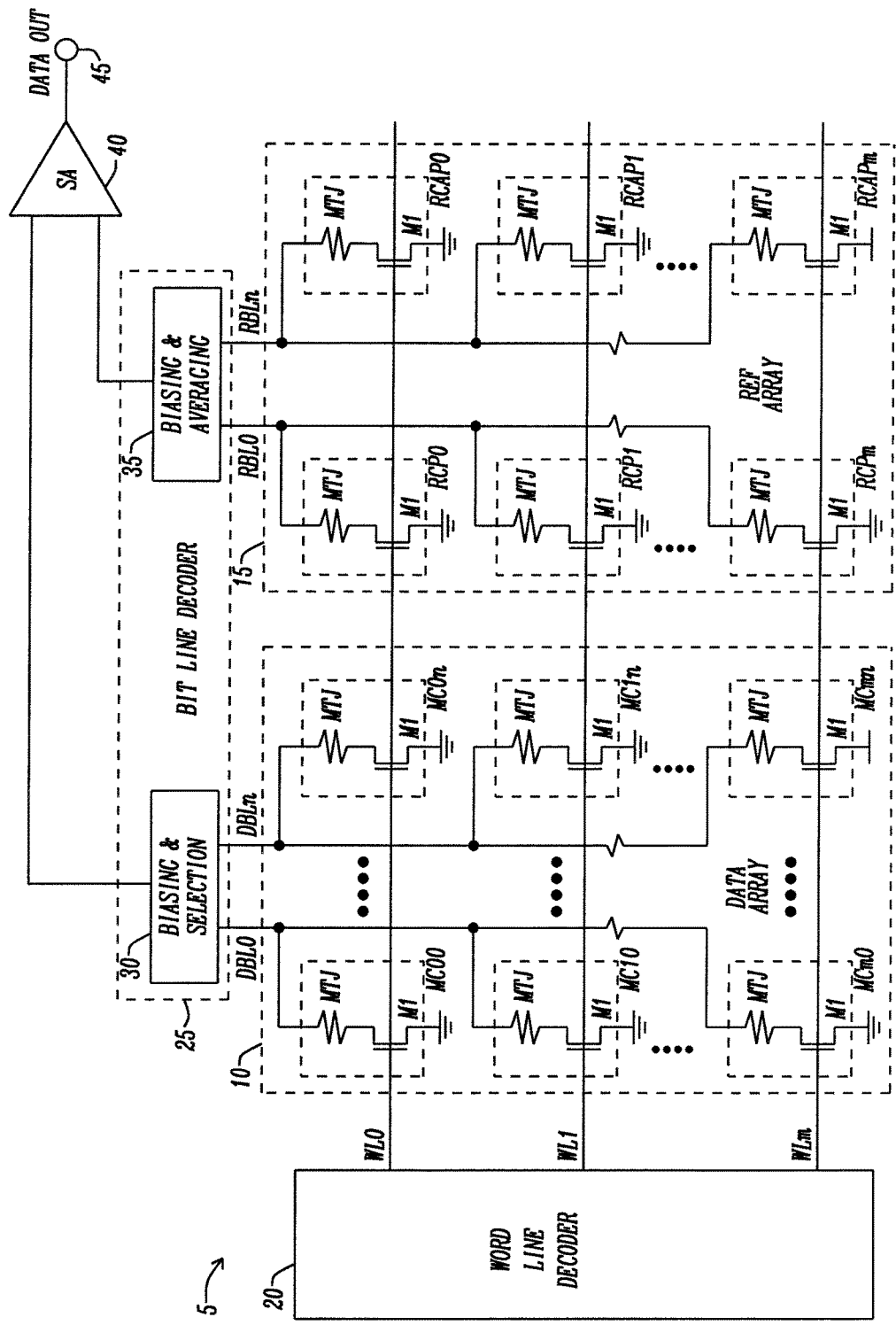
FIG. 1 is a schematic diagram of a magnetic memory array of the related art.
Figure 3:
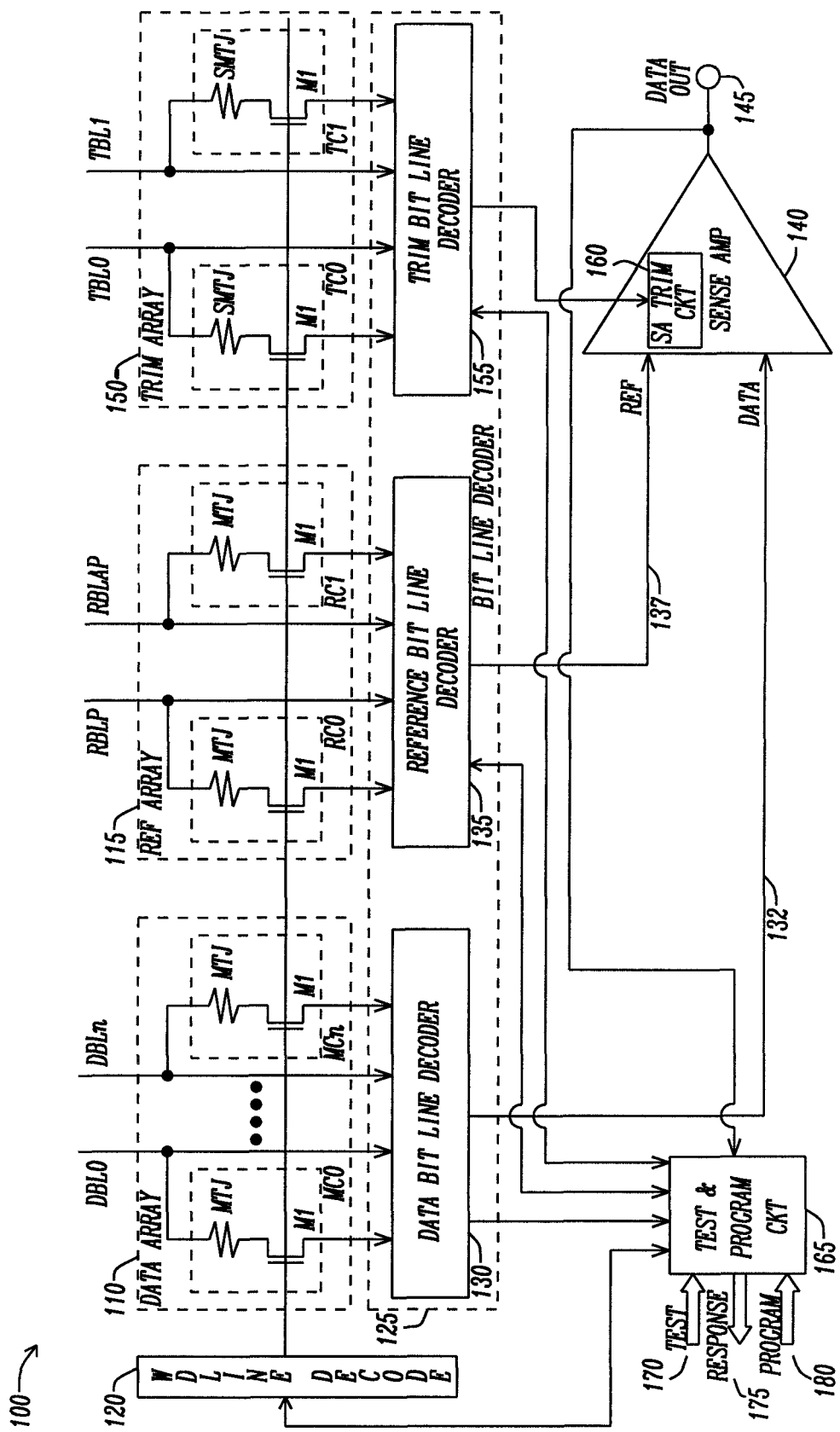
FIG. 3 is a schematic diagram of a magnetic memory array illustrating a sense amplifier offset trim circuit embodying the principles of the present disclosure.

FIG. 3 is a schematic diagram of a magnetic memory array 100 illustrating a sense amplifier offset trim circuit that includes the trim magnetic tunnel junction array 150, the trim bit line decoder 155 and the sense amplifier trim circuit 160. The magnetic memory array 100 includes the data magnetic memory sub-array 110 and the reference magnetic memory sub-array 115. The data magnetic memory sub-array 110 is structured and functions as the data magnetic memory sub-array 10 as shown in FIG. 1, except the data magnetic memory sub-array 110 is shown as a single row of the sub-array. The reference magnetic memory sub-array 115 is similarly structured and functions as the reference magnetic memory sub-array 15 as shown in FIG. 1, except the reference magnetic memory sub-array 115 is shown as a single row of the sub-array. The bit line decoder 125 is equivalent to the bit line decoder 25 of FIG. 1 with a data bit line decoder 130 and a reference bit line decoder 135 that are structured and function as the data bit line decoder 30 and a reference bit line decoder 35 of FIG. 1. The word line decoder 120 is connected to the word line WL that is similarly connected to the row of the data magnetic memory sub-array 110 and the reference magnetic memory sub-array 115.

The outputs of the data bit line decoder 130 and reference bit line decoder 135 are connected respectively to the data input 132 and reference input 137 of the sense amplifier 140. The sense amplifier 140 compares the signal level (current or voltage) of the data input 132 with the reference input 137 to determine the data retained by the data memory array 130.

As is known in the art, a sense amplifier 140 is formed, at a basic level, from a differential amplifier configured as a comparator. As described above, the sense amplifier is subject to a first type of variation that usually manifests itself as variation in sense amplifier offset. The second source of variation is the contribution from parasitic impedance, such as bit line resistance. The third source of variation is from the variation between reference devices themselves. To compensate for the variation the sense amplifier has a sense amplifier trim circuit 160 that provides an adjustment signal to the data input 132 and reference input 137 to overcome the variations as described. The output of the trim bit line decoder 155 is the trim data that is applied to the sense amplifier trim circuit 160. The sense amplifier trim circuit 160 interprets the trim data to establish the offset trim level for sense amplifier 140.

The magnetic memory 100 has a trim array 150 that retains the trim data for setting the offset trim level for maximizing the read margin for the data magnetic memory sub-array 110. The trim array 150 is formed of magnetic tunnel junction memory cells TC0 and TC1. The trim magnetic junction memory cells are formed of a small magnetic tunnel junction element SMTJ and a gating transistor M1. The small magnetic tunnel junction element SMTJ is patterned smaller than the regular magnetic tunnel junction elements MTJ of the data magnetic memory array 110 and the reference magnetic memory array 115. The gating transistor M1 is identical in structure and performance as the gating transistors M1 of the data magnetic memory array 110 and the reference magnetic memory array 115. This effectively increases the voltage across the smaller tunnel junction elements SMTJ due to the voltage divider effect and increases the ratio signal (Rmtj/Rcmos) of the resistance Rmtj of the smaller magnetic tunnel junction elements SMTJ to the resistance Rcmos of the gating transistors M1, while maintaining the regular layout of the memory array. The distribution of resistance of those MTJ and their writability/data retention is of minor effect that relaxes greatly their manufacturability.

If the trim magnetic junction memory cells were manufactured with the structure and dimensions of the regular magnetic tunnel junction elements MTJ of the data magnetic memory array 110 and the reference magnetic memory array 115, the magnetic tunnel junction would need to be exposed to a much high voltage level than the regular magnetic tunnel junction elements MTJ of the data magnetic memory array 110 and the reference magnetic memory array 115 to cause the high voltage stress in the thin oxide barrier of the trim magnetic tunnel junction elements. The high voltage stress causes trap generation to degrade the thin oxide barrier and finally start forming pinholes through the thin oxide barrier. Subsequent growth of these pinholes leads to an electrical short between the two electrodes of the trim magnetic tunnel junction element.

Since this breakdown is voltage dependent, one has to expose the trim magnetic tunnel junction elements to voltages much higher than the regular magnetic tunnel junction elements MTJ of the data magnetic memory array 110 and the reference magnetic memory array 115. This can be achieved by over-driving the trim array 150 momentarily so as not to compromise the long-term reliability of the trim array 150. Additionally, since a lot of the voltage drop is present in the magnetic tunnel junction memory cells TC0 and TC1 across the trim magnetic tunnel junction element, the size of the driving transistor M1 of the magnetic tunnel junction memory cells TC0 and TC1 to increase the voltage drop across the trim magnetic tunnel junction. This would increase the overhead needed and disturb the pattern of array transistors. The preferred embodiment of this disclosure is for the smaller trim magnetic tunnel junction element SMTJ.

As with the magnetic memory cells MC0, ... MCn of the data magnetic memory array 110 and the magnetic memory cells RC0 and RC1 of the reference memory array 115, the trim magnetic memory cells TC0 and TC1 of the trim array 150 has a magnetic tunnel junction element SMTJ and a gating transistor M1 connected serially. A drain of each of the gating transistors M1 is connected to a first terminal of the associated magnetic tunnel junction element SMTJ. The source of each of the gating transistors M1 is connected to the trim bit line decoder 155. The second terminal of the magnetic tunnel junction element SMTJ situated on one column are commonly connected to a trim bit line TBL0 or TBL1 associated with the one column. The trim bit line TBL0 or TBL1 are connected to the trim bit line decoder 155. The trim bit line decoder 155 provides the necessary biasing signals for writing the trim data to the trim magnetic memory cells TC0 and TC1 such that the required anti-fuse devices of the magnetic tunnel junction element SMTJ are blown for programming the trim array 100.

The magnetic memory 100 has a test and program circuit 165 that is in communication with an external test system (discussed hereinafter). The external test system provides test signals 170 to the test and program circuit 165 and receives test response signals 175 from the test and program circuit 165. Upon evaluation of the test response signals 175, the external test system provides the programming code signals 180 to the test and program circuit 165. The test and program circuit 165 is connected to communicate decoded test signals to the word line decoder 120, the data bit line decoder 130, the reference bit line decoder 135 and the trim bit line decoder 155 to establish the necessary test conditions to evaluate the operation of the magnetic memory 100.

The test and program circuit 165 is also connected to receive the data output 145 of the sense amplifier 140. The test and program circuit 165 transmits the data output 145 of each of the sense amplifiers 140 as the test response 175 to the external test system.

Figure 4:
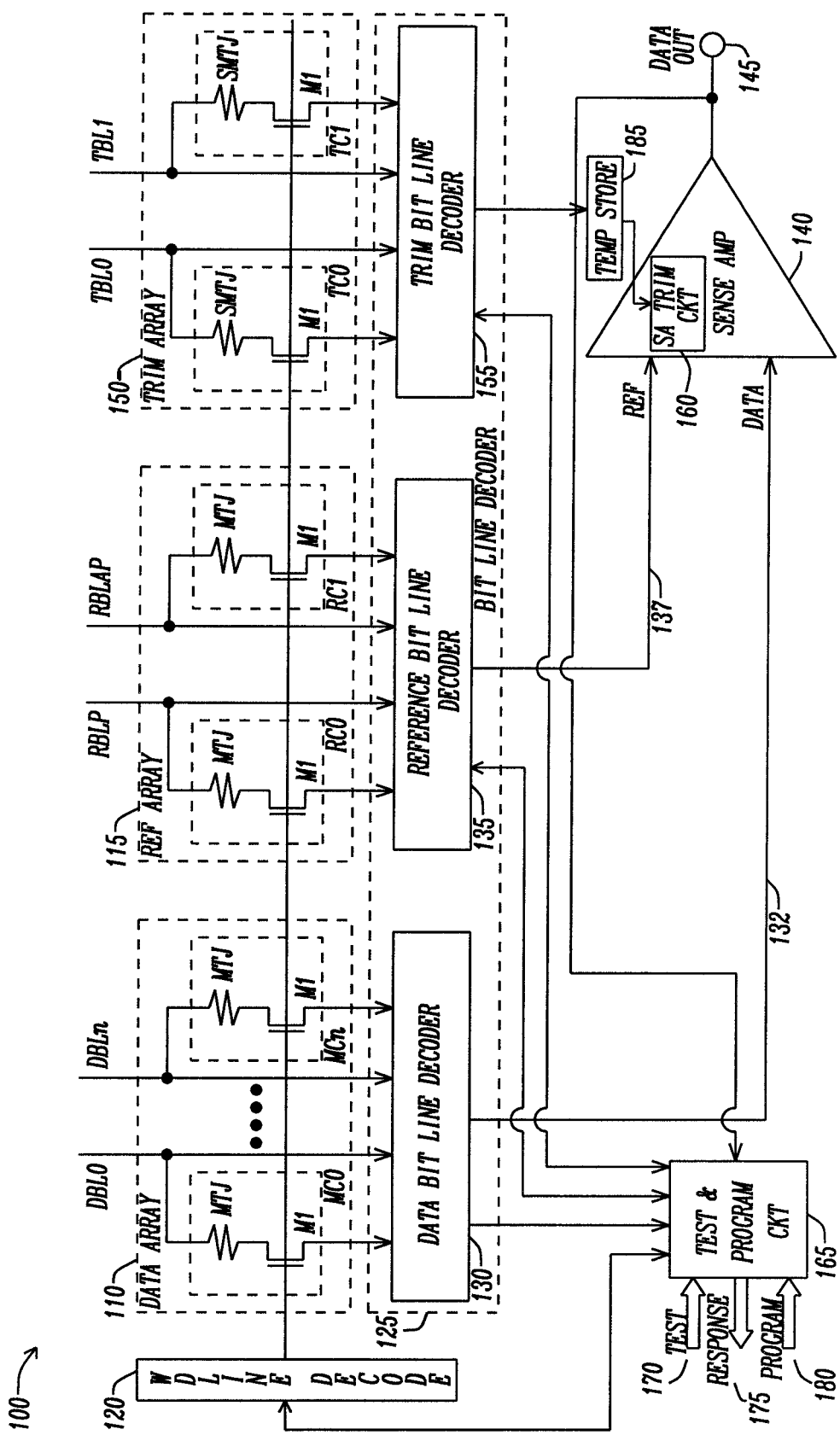
FIG. 4 is a schematic diagram of a magnetic memory array illustrating a second embodiment of a sense amplifier offset trim circuit embodying the principles of the present disclosure.

FIG. 4 is a schematic diagram of a magnetic memory array 100 illustrating a second embodiment of a sense amplifier offset trim circuit that includes the trim magnetic tunnel junction array 150, the trim bit line decoder 155, trim temporary store 185, and the sense amplifier trim circuit 160. The structure of this second embodiment of the magnetic memory array 100 is structured and functions as described above for FIG. 3 with the exception of the addition of the trim temporary store 185. The trim magnetic tunnel junction array 150 may be part of the data magnetic memory array 110 or a separate permanent memory or register. If the trim magnetic tunnel junction array 150 is structured such that the trim data must be refreshed at the sense amplifier trim circuit 160 with every read cycle, the access to the trim data may be slow. To compensate for this delay, the trim temporary store 185 is structured as an SRAM or register that has sufficient performance to prevent delay during a read cycle. Preferably, the trim temporary store is an SRAM formed of magnetic tunnel junction logic circuits that matches the performance of the data magnetic memory array 110 and the reference memory array 115.

Figure 5:
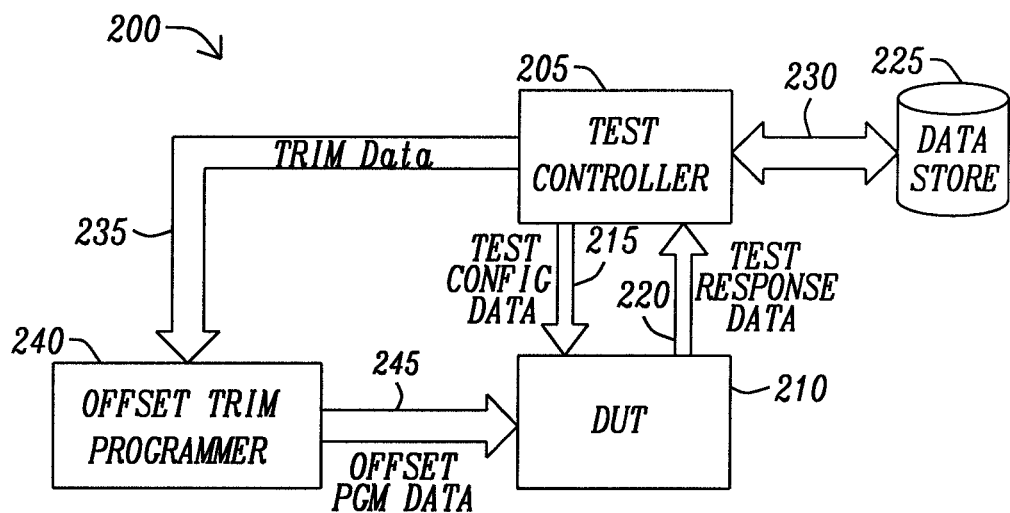
FIG. 5 is a block diagram of a test system for evaluating a magnetic memory device and establishing the offset signal level to be applied to adjust the reference signal to improve the read margin of the sense amplifier of the magnetic memory device embodying the principles of this disclosure.

FIG. 5 is a block diagram of a test system 200 for evaluating and establishing the offset signal level that needs to be applied to adjust the reference signal to improve the read margin of the sense amplifier of a magnetic memory device. The test system 200 includes a test controller 205 connected to a device-under-test fixture 210 to transfer the test configuration data signals 215 from the test controller 205 to the device-under-test fixture 210. The device-under-test fixture 210 further transfers the test response data 220 to the test controller 210. The test configuration data signals 215 provide the address location selection data, the data patterns to be written to the magnetic memory device place in the device-under-test fixture 210, the offset origin and incrementing factors for the testing of the magnetic memory device place in the device-under-test fixture 210. The test response data signals 220 transfer the data read from the selected address locations to the test controller 205 for evaluation.

The test controller 205 is connected to an offset trim programmer 240 to transfer the trim data 235 from the test controller 205 to the offset trim programmer 240. The offset trim programmer 240 is connected to the device-under-test fixture 210 to transfer the offset program data 245 and biasing instructions to the magnetic memory device in the device-under-test fixture 210. The offset program data 245 identifies the offset signal level to be programmed to the trim array 150 of FIGS. 3 and 4.

The test controller 205 is connected to a data storage unit 225. The data storage unit 225 may be any form of semiconductor memory, magnetic disk or tape storage, or optical disk or any other computer processor readable medium having stored thereon a program of instructions readable and executable by the test controller 205 for performing a method for testing magnetic memory for determining offset trim values that are transferred to a trim array of a magnetic memory for storage. The data storage unit 225 retains the test configuration data 215 that is transferred from the test controller 205 to the magnetic memory device in the device-under-test fixture 210. The data storage unit 225 further retains the test response data 220 that is transferred from the magnetic memory device in the device-under-test fixture 210 to the test controller 205. Still further, the data storage unit 225 retains any other intermediate data that is required by the test controller 205 for operation in developing the trim data 235. In many embodiments, the test controller 205 is a computer processor connected to unique testing circuitry including the offset trim programmer, the device-under-test fixture 210 and any ancillary hardware necessary for testing the magnetic memory.

Figure 6:
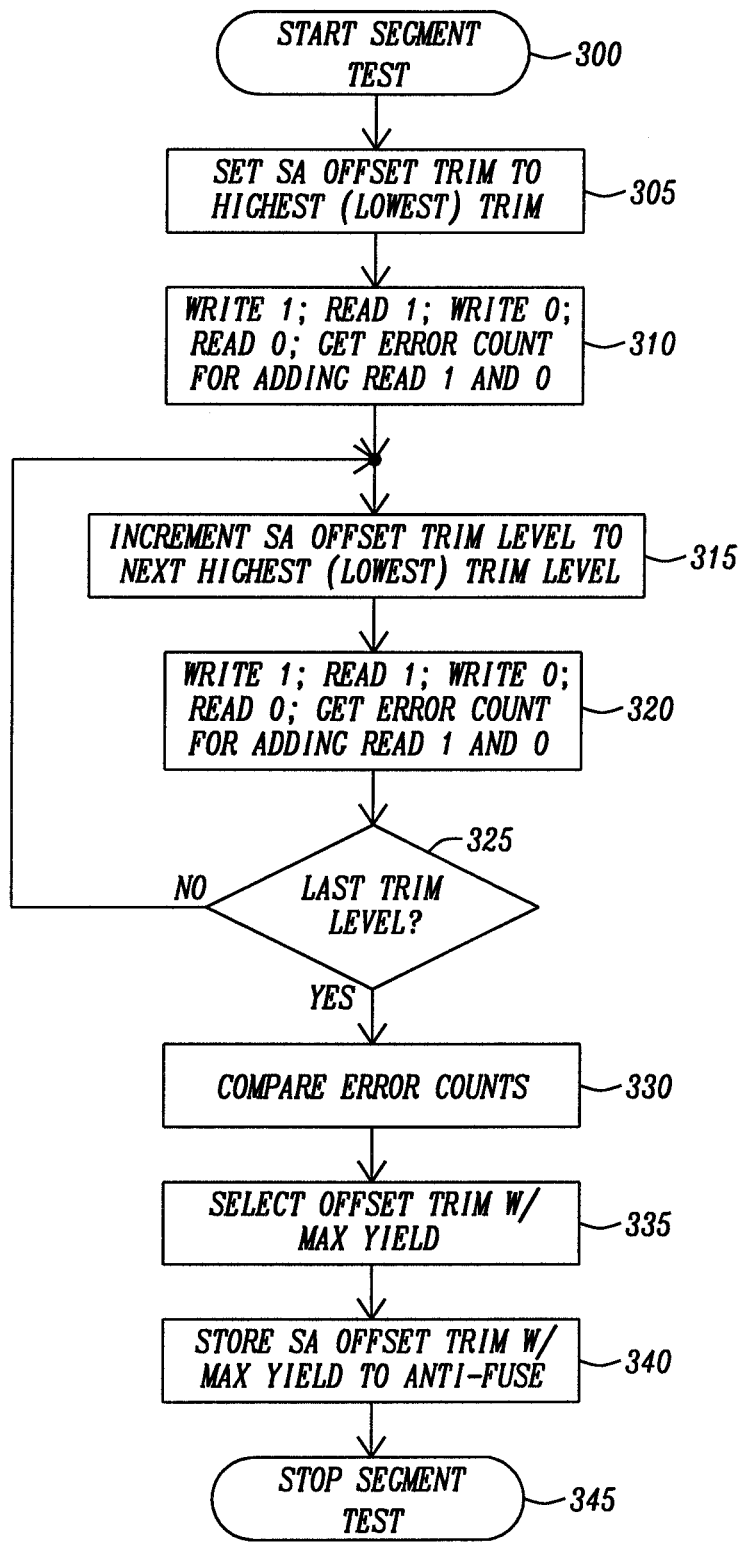
FIG. 6 is a flowchart for a method for establishing an offset signal level to be applied to adjust the reference signal to improve the read margin of the sense amplifier of a magnetic memory device embodying the principles of this invention.

FIG. 6 is a flowchart for a method for establishing an offset signal level to be applied to adjust the reference signal to improve the read margin of the sense amplifier of a magnetic memory device. The method as executed by the test controller 205 of FIG. 5 begins (Box 300) by starting the test of a selected segment of the magnetic memory. The offset signal level of the sense amplifier(s) of the segment of the magnetic memory is set (Box 305) to an initial signal level. This maybe the highest or lowest of the offset signal level within an adaptive band ΔREF as shown in FIG. 2 within which the magnitude of the reference signal is allowed to vary. The test configuration data 215 of FIG. 5 is set (Box 310) to write a signal level representative of a first binary level ("1") to all the magnetic memory cells of the selected segment of the magnetic memory. The segment of the magnetic memory is read (Box 310) and the number of errors within the segment is accumulated. The test configuration data 215 is set (Box 310) to write a signal level representative of a second binary level ("0") to all the magnetic memory cells of the selected segment of the magnetic memory. The segment of the magnetic memory is read (Box 310) and the number of errors within the segment is accumulated. The total accumulated errors are recorded (Box 310).

The offset signal level of the sense amplifier(s) of the segment of the magnetic memory is then incremented (Box 315) to a next offset signal level. The test configuration data 215 of FIG. 5 is set (Box 320) to write a signal level representative of a first binary level ("1") to all the magnetic memory cells of the selected segment of the magnetic memory. The segment of the magnetic memory is read (Box 320) and the number of errors within the segment is accumulated. The test configuration data 215 is set (Box 320) to write a signal level representative of a second binary level ("0") to all the magnetic memory cells of the selected segment of the magnetic memory. The segment of the magnetic memory is read (Box 320) and the number of errors within the segment is accumulated. The total accumulated errors are recorded (Box 320).

The increment of the trim level is tested (Box 325) to determine if the last offset signal level of the adaptive band ΔREF within which the reference level signal is allowed to vary. If the increment is not the last offset signal level, the offset signal level is incremented to the next offset signal level (Box 315) and the magnetic memory cells are written and read for the first and second binary levels (Box 320), and the error count for the segment of the magnetic memory is determined (Box 320). This repeated until all the offset signal levels within the adaptive band ΔREF within which the reference level signal is allowed to vary have been tested.

When the segments of the magnetic memory has been tested for all the trim levels, the error counts for all the offset signal levels are compared (Box 330) are compared to determine which of the offset signal levels provides the greatest yield with the lowest error count. The offset signal level with the greatest yield is selected (Box 335) and the trim data indicating the selected offset signal level is programmed (Box 340) to the trim magnetic memory array 150 of FIGS. 3 and 4. The testing and programming of the offset signal level for the selected segment is completed and the testing stopped (Box 345). If there other segments of the magnetic to have their offset level adjusted, this method as described is repeated for each segment until all segments have been tested and their offset signal level programmed as trim data to their trim magnetic memory array 150.

Figure 7A:
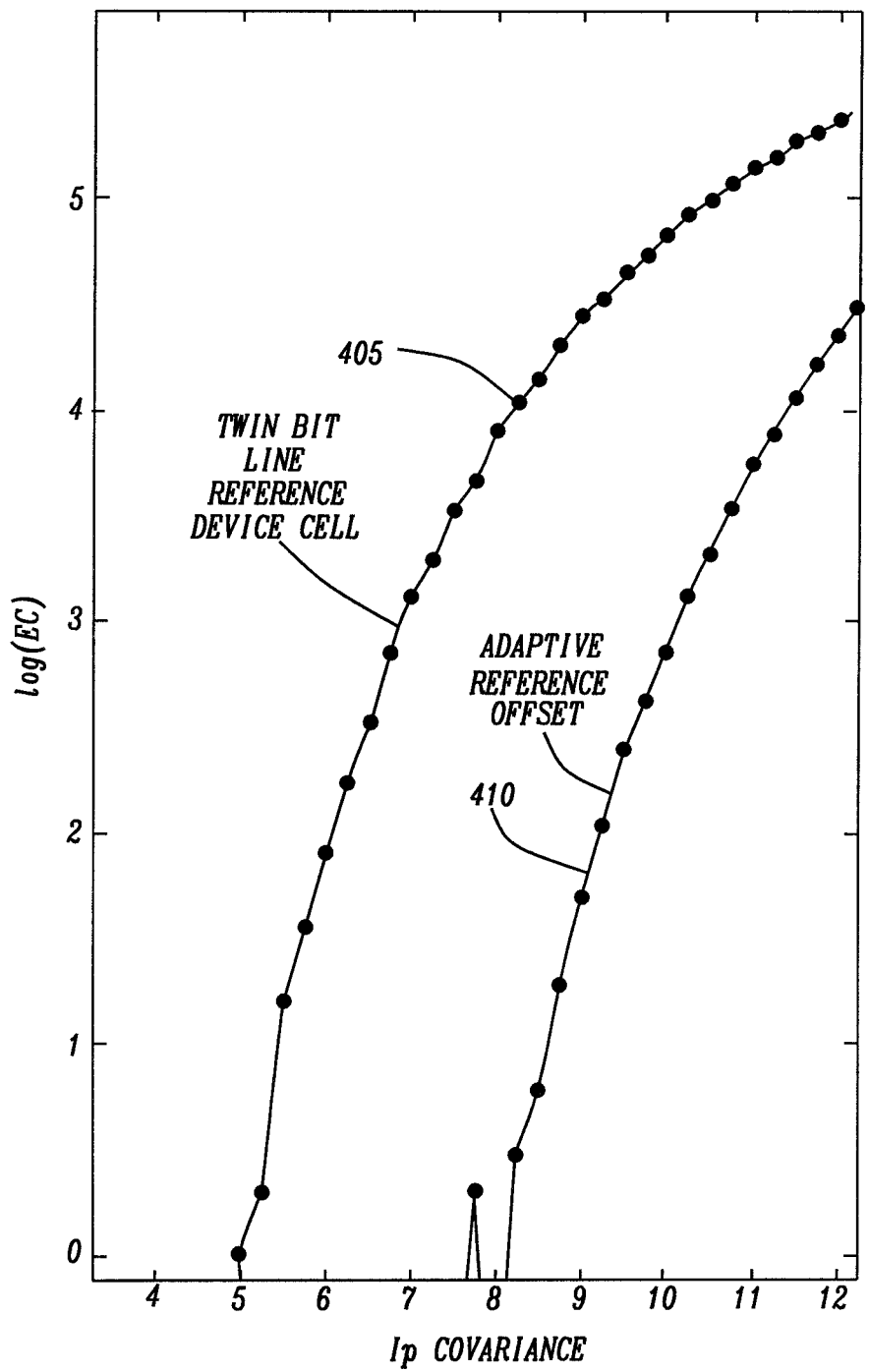
FIGS. 7a-7d are plots of simulated results for the fail rate of a complete 10 MBit chip as a function of device-to-device variations comparing the method embodying the principles for adjusting the reference signal of this disclosure compared with reference generation techniques of the prior art.

FIGS. 7a-7d are plots of simulated results for the fail rate of a complete 10 MBit magnetic memory chip as a function of device-to-device variations comparing the method embodying the principles for adaptively offsetting of the reference signal of this disclosure compared with a twin bit reference generation technique of the FIG. 1. FIG. 7a is a plot of the error count versus the simulated current covariance for averaged twin reference bit lines 405 of the prior art of FIG. 1 and the adaptive offset voltage reference embodiment 410 embodying the principles of this disclosure. The read current covariance is the horizontal axis of the plot and is determined by the formula:

$$Ip_{Cov} = \frac{\sigma_{Ip}}{\bar{Ip}}$$

Where:
$Ip_{Cov}$ is the covariance of the Read Current.
$\sigma_{Ip}$ is the variance of the Read Current.
$\bar{Ip}$ is the median of the Read Current.

The plot of the read current covariance $Ip_{Cov}$ shows that the error level for the twin bit reference cells 405 in the 10 Mbit chip is significantly larger than the error level for the adaptive offset voltage reference embodiment 410 in the 10 Mbit magnetic memory chip.

Figure 7B:
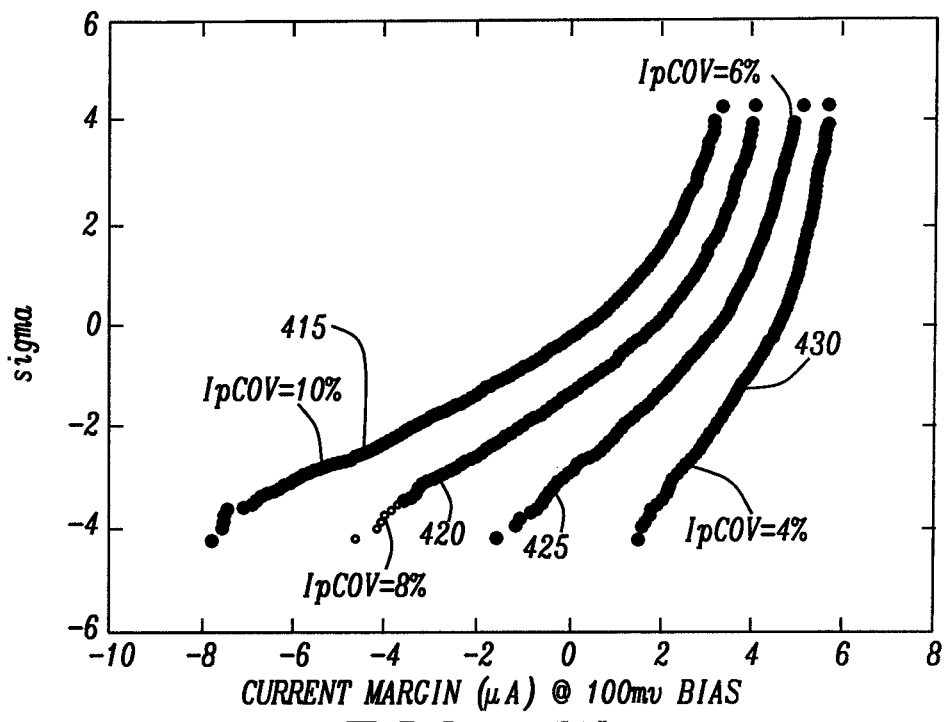
Figure 7C:
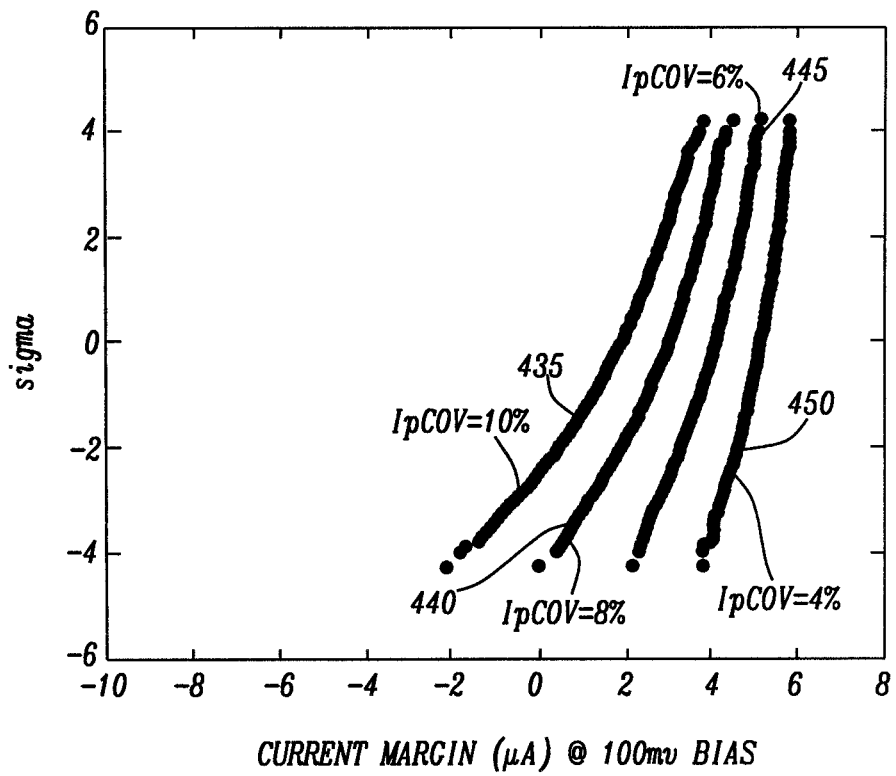
Figure 7D:
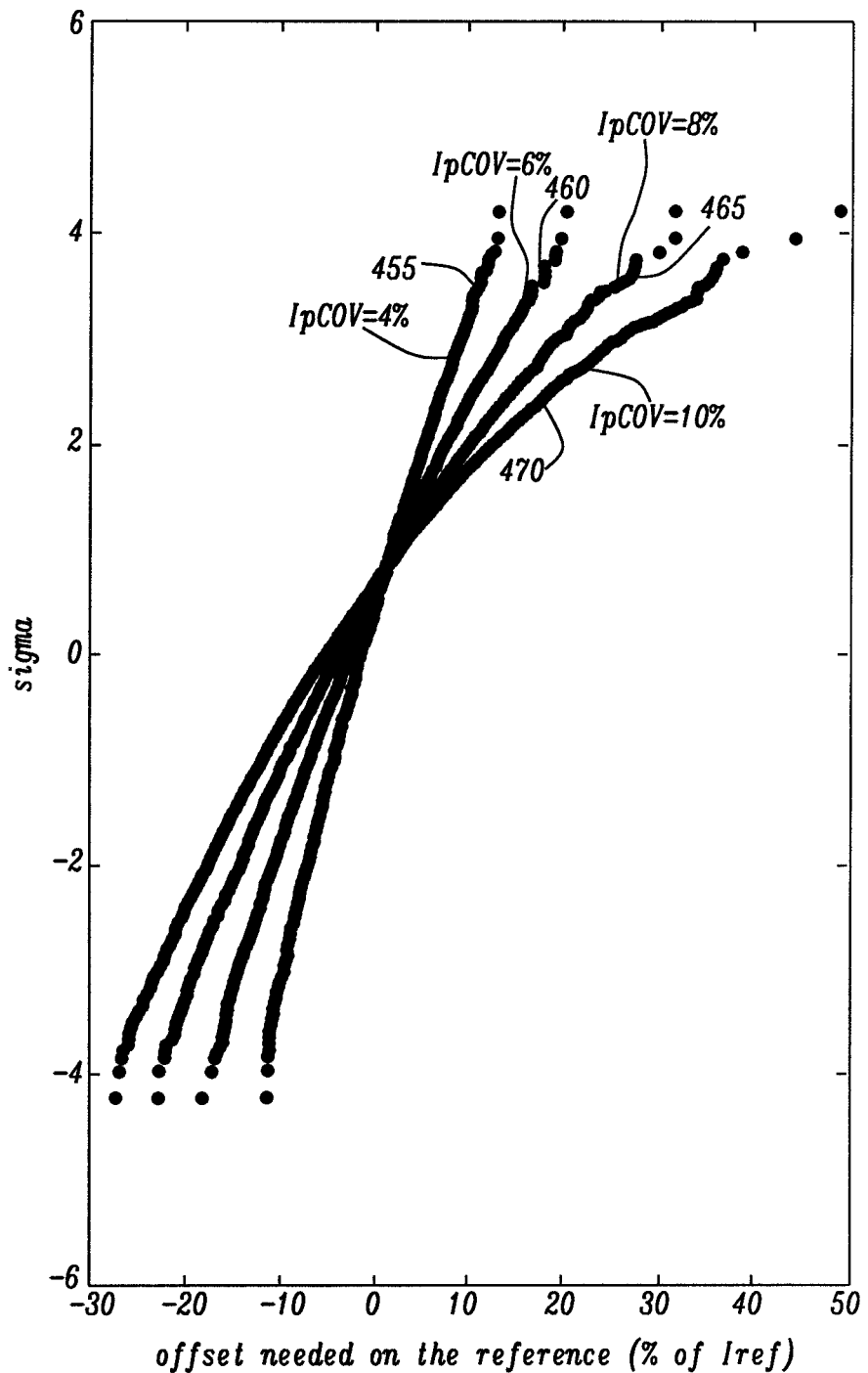

FIG. 7b is the populations of 128K bit segments of the 10 Mbit magnetic memory chip showing their read current margins for covariances of 10% 415, 8% 420, 6%, 425 and 4% 430 for the twin bit reference cells 405. FIG. 7c is the populations of 128K bit segments of the 10 Mbit magnetic memory chip showing their read current margins for covariances of 10% 435, 8% 440, 6% 445, and 4% 450 for the adaptive offset voltage reference embodiment 410. It is apparent that the adaptive offset voltage reference embodiment 410 has a tighter read margin when compared to the twin bit reference cells 405. FIG. 7d illustrates the populations of 128K bit segments of the 10 Mbit magnetic memory chip showing the offset voltage required for the reference provided to the sense amplifiers for the covariances of 4% 455, 6% 460, 8% 465, and 10% 470 for the adaptive offset voltage reference embodiment 410. The largest and smallest offset trim signal levels for the magnetic memory cells are chosen dependent on the read current margins acceptable by the magnetic memory cells. If the read current covariance of the magnetic memory cells is 4% 455, the offset signal level is approximately ±10%. If the read current covariance of the magnetic memory cells is 6% 460, the offset signal level is approximately ±18%. If the read current covariance of the magnetic memory cells is 8% 465, the offset signal level is approximately ±22%. If the read current covariance of the magnetic memory cells is 10% 470, the offset signal level is approximately ±30%. The increments of the trim level of the adaptive band ΔREF within which the reference level signal is allowed to vary is divided approximately evenly within the selected band.

While this disclosure has been particularly shown and described with reference to the preferred embodiments thereof, it will be understood by those skilled in the art that various changes in form and details may be made without departing from the spirit and scope of the disclosure.

What is claimed is:

1. A test system for evaluating and establishing a magnitude of an offset trim signal that is applied to adjust a reference signal to improve a read margin of a plurality of sense amplifiers of a magnetic memory device comprising an adaptive trimming circuit, wherein the test system comprises:

a test controller for activating test circuitry to provide test signals to and receive test responses from a magnetic memory device to perform a method for establishing an offset signal level to be applied to adjust the reference signal to improve the read margin of each of the plurality of the sense amplifiers of a magnetic memory device;

a data storage unit in communication with the test controller that includes non-transitory media having stored thereon a program of instructions readable and executable by the test controller, wherein the instructions activate the test circuitry to provide the test signals to a magnetic memory device to perform a method for establishing a magnitude of the offset trim signal to be applied to adjust the reference signal to improve the read margin of each of the plurality of sense amplifiers of the magnetic memory device;

wherein the method for establishing a magnitude of the offset trim signal comprises the steps of:
a) selecting an array segment of the magnetic memory device
b) setting the offset trim level of at least one sense amplifier of the array segment of the magnetic memory to an initial trim signal level;
c) writing a signal level representative of a first binary level to all the magnetic memory cells of the selected array segment of the magnetic memory device;
d) reading the selected array segment of the magnetic memory device;
e) accumulating a number of errors within the selected array segment;
f) writing a signal level representative of a second binary level to all the magnetic memory cells of the selected array segment of the magnetic memory device;
g) reading the selected array segment of the magnetic memory device;
h) accumulating the number of errors within the selected array segment;
i) totaling accumulated errors within the selected array segment;
j) incrementing the offset trim level to a next signal level
k) repeating steps b) through i) until a last trim level of an adaptive band within which the reference level signal is allowed to vary have been tested;
l) comparing the error counts for all the offset trim levels for determining which of the offset trim levels provides the greatest yield with the lowest error count;
m) selecting the offset trim level with the greatest yield; and
n) programming offset trim data indicating the selected offset trim level is programmed to the adaptive trimming circuit.

2. The test system for evaluating and establishing a magnitude of an offset trim signal of claim 1 wherein the method further comprises:
selecting other segments of the magnetic memory device to have their offset level adjusted; and
repeated steps a) through n) for each segment until all segments have been tested and their offset trim level programmed as trim data to the adaptive trimming circuits of the selected array segment.

3. The test system for evaluating and establishing a magnitude of an offset trim signal of claim 1 wherein the initial trim signal level is the highest or lowest magnitude of the offset trim level within an adaptive band within which the reference level signal is allowed to vary.

4. The test system for evaluating and establishing a magnitude of an offset trim signal of claim 1 wherein the adaptive trimming circuit within a magnetic memory device comprises:
- a trim one-time programmable memory array formed of a plurality of one-time programmable memory cells that are programmed with trim data representing magnitudes of a plurality of offset trim signals that modifies a plurality of reference signal levels applied to a plurality of sense amplifiers connected for sensing data present in an array of magnetic memory cells;
- a plurality of trim bit lines connected such that each bit line is connected to a column of the one-time programmable memory cells for transferring a programming trim signal to selected one-time programmable memory cells for programming the selected one-time programmable memory cells with the trim data and reading the trim data from the selected one-time programmable memory cells;
- a trim bit line decoder connected to the plurality of trim bit lines for selecting and biasing the trim bit lines for programming and reading the selected one-time programmable memory cells of the trim one-time programmable memory array; and
- a plurality of sense amplifier trimming circuits connected such that each sense amplifier trimming circuit is in communication with the trim bit line decoder for receiving trim data transferred from the trim one-time programmable memory array wherein each sense amplifier trimming circuit decodes the trim data to determine the magnitude of offset trim signal that is applied to adjust the reference signal to improve the read margin of each of the plurality of the sense amplifiers.

5. The test system for evaluating and establishing a magnitude of an offset trim signal of claim 4 wherein the one-time programmable memory cells are formed of magnetic tunnel junction elements that are exposed to sufficient voltage such that the magnetic tunnel junction elements are structured as anti-fuses.

6. The test system for evaluating and establishing a magnitude of an offset trim signal of claim 5 wherein the magnetic tunnel junction elements of the one-time programmable magnetic tunnel junction memory cells have smaller feature sizes than those of a data magnetic memory array to effectively increase the resistance of the one-time programmable magnetic memory cells of the trim one-time programmable memory array while not affecting the data magnetic memory cells during the programming of the one-time programmable magnetic memory cells of the trim one-time programmable memory array.

7. The test system for evaluating and establishing a magnitude of an offset trim signal of claim 6 wherein the trim bit line decoder generates biasing signals for programming the one-time programmable cells such that two electrodes of the magnetic tunnel junction element are electrically shorted.

8. The test system for evaluating and establishing a magnitude of an offset trim signal of claim 4 wherein the adaptive trimming circuit further comprises a temporary storage array connected between the trim bit line decoder and the sense amplifier trim circuits for receiving and retaining the trim data from the trim one-time programmable read only array to provide a faster access time for transferring the trim data to the sense amplifier trim circuit during operation.

9. The test system for evaluating and establishing a magnitude of an offset trim signal of claim 8 wherein the temporary storage is a static random access memory (SRAM) or data registers.

10. The test system for evaluating and establishing a magnitude of an offset trim signal of claim 9 wherein the SRAM or the data registers are formed of magnetic tunnel junction logic elements.

11. A method for evaluating and establishing a magnitude of an offset trim signal that is applied to adjust a reference signal to improve a read margin of sense amplifiers of a magnetic memory device comprising an adaptive trimming circuit, comprises the steps of:
- a) providing the magnetic memory device comprising an adaptive trimming circuit;
- b) selecting an array segment of the magnetic memory device
- c) setting the offset trim level of at least one sense amplifier of the array segment of the magnetic memory to an initial trim signal level;
- d) writing a signal level representative of a first binary level to all the magnetic memory cells of the selected array segment of the magnetic memory device;
- e) reading the selected array segment of the magnetic memory device;
- f) accumulating a number of errors within the selected array segment;
- g) writing a signal level representative of a second binary level to all the magnetic memory cells of the selected array segment of the magnetic memory device;
- h) reading the selected array segment of the magnetic memory device;
- i) accumulating the number of errors within the selected array segment;
- j) totaling accumulated errors within the selected array segment;
- k) incrementing the offset trim level to a next signal level
- l) repeating steps c) through k) until a last trim level of an adaptive band within which the reference level signal is allowed to vary have been tested;
- m) comparing the error counts for all the offset trim levels for determining which of the offset trim levels provides the greatest yield with the lowest error count;
- n) selecting the offset trim level with the greatest yield; and
- o) programming offset trim data indicating the selected offset trim level is programmed to the adaptive trimming circuit.

12. The method for evaluating and establishing a magnitude of an offset trim signal of claim 11 wherein the method further comprises:
- selecting other segments of the magnetic memory device to have their offset level adjusted; and
- repeated steps b) through o) for each segment until all segments have been tested and their offset trim level programmed as trim data to the adaptive trimming circuits of the selected array segment.

13. The method for evaluating and establishing a magnitude of an offset trim signal of claim 11 wherein the initial trim signal level is the highest or lowest magnitude of the offset trim level within an adaptive band within which the reference level signal is allowed to vary.

14. The method for evaluating and establishing a magnitude of an offset trim signal of claim 11 wherein the adaptive trimming circuit within a magnetic memory device comprises:

a trim one-time programmable memory array formed of a plurality of one-time programmable memory cells that are programmed with trim data representing magnitudes of a plurality of offset trim signals that modifies a plurality of reference signal levels applied to a plurality of sense amplifiers connected for sensing data present in an array of magnetic memory cells;

a plurality of trim bit lines connected such that each bit line is connected to a column of the one-time programmable memory cells for transferring a programming trim signal to selected one-time programmable memory cells for programming the selected one-time programmable memory cells with the trim data and reading the trim data from the selected one-time programmable memory cells;

a trim bit line decoder connected to the plurality of trim bit lines for selecting and biasing the trim bit lines for programming and reading the selected one-time programmable memory cells of the trim one-time programmable memory array; and a plurality of sense amplifier trimming circuits connected such that each sense amplifier trimming circuit is in communication with the trim bit line decoder for receiving trim data transferred from the trim one-time programmable memory array wherein each sense amplifier trimming circuit decodes the trim data to determine the magnitude of offset trim signal that is applied to adjust the reference signal to improve the read margin of each of the plurality of sense amplifiers.

15. The method for evaluating and establishing a magnitude of an offset trim signal of claim 14 wherein the one-time programmable memory cells are formed of magnetic tunnel junction elements that are exposed to sufficient voltage such that the magnetic tunnel junction elements are structured as anti-fuses.

16. The method for evaluating and establishing a magnitude of an offset trim signal of claim 15 wherein the magnetic tunnel junction elements of the one-time programmable magnetic tunnel junction memory cells have smaller feature sizes than those of a data magnetic memory array to effectively increase the resistance of the trim data magnetic memory cells while not affecting the data magnetic memory cells during the programming of the trim data one-time programmable magnetic memory cells of the trim one-time programmable memory array.

17. The method for evaluating and establishing a magnitude of an offset trim signal of claim 16 wherein the trim bit line decoder generates biasing signals for programming the one-time programmable cells such that two electrodes of the magnetic tunnel junction element are electrically shorted.

18. The method for evaluating and establishing a magnitude of an offset trim signal of claim 17 wherein the adaptive trimming circuit further comprises a temporary storage array connected between the trim bit line decoder and the sense amplifier trim circuits for receiving and retaining the trim data from the trim one-time programmable read only array to provide a faster access time for transferring the trim data to the sense amplifier trim circuit during operation.

19. The method for evaluating and establishing a magnitude of an offset trim signal of claim 18 wherein the temporary storage is a static random access memory (SRAM) or data registers.

20. The method for evaluating and establishing a magnitude of an offset trim signal of claim 19 wherein the SRAM or the data registers are formed of magnetic tunnel junction logic elements.

\* \* \* \* \*